United States Patent

[11] 3,597,660

[72] Inventors Stanley M. Jensen Apalachin; Thomas J. Kopl, Endicott; Vincent P. Subik, Binghamton; Henry R. Tatko, Endicott; Gordon L. Williams, Vestal, all of, N.Y.

[21] Appl. No. 883,706

[22] Filed Dec. 10, 1969

[45] Patented Aug. 3, 1971

[73] Assignee International Business Machines Corporation Armonk, N.Y.

[54] HIGH-DENSITY CIRCUITS CONNECTOR
7 Claims, 6 Drawing Figs.

[52] U.S. Cl. .......... 317/101 C, 317/101 CC, 339/17

[51] Int. Cl. .......... H02b 1/02

[50] Field of Search .......... 317/101 DA, 101 F, 101 CC, 101 A; 339/17 F, 17 LC, 17 M; 174/117.5

[56] References Cited

UNITED STATES PATENTS

| | | | |
|---|---|---|---|
| 3,376,479 | 4/1968 | Wines et al. | 317/101 DH (UX) |
| 3,418,534 | 12/1968 | Koons et al. | 317/101 DH (UX) |
| 3,499,220 | 3/1970 | Hintz et al. | 317/101 F (UX) |
| 3,500,289 | 3/1970 | Herb | 339/17 F (UX) |

*Primary Examiner*—David Smith, Jr.
*Attorneys*—Hanifin and Jancin and Charles S. Neave

ABSTRACT: A high-density circuits connector assembly for interconnecting the edge conductors of module circuit boards with the I/O (input/output) circuits conductors of a cabling network of a data processing system. The connector assembly comprises signal and ground overlays formed by printed circuit techniques to provide conductive copper paths affixed to a flexible thin layer of polyimide material which are registered and attached at the edges of the module boards. An interconnecting contact pressure is achieved by a force mechanism comprising a resilient pad directly in contact with the overlays and a pressure-applying mechanism. The overlays function as a matched impedance I/O connector for interconnecting the module circuits boards with the other circuits wiring of a data processing system.

INVENTORS
STANLEY M. JENSEN
THOMAS J. KOPL
VINCENT P. SUBIK
HENRY R. TATKO
GORDON L. WILLIAMS

BY [signature]
AGENT

HIGH-DENSITY CIRCUITS CONNECTOR

BACKGROUND OF THE INVENTION

1. Field of the Invention.

This invention relates to the packaging and I/O (input/output) interconnections of microminiaturized circuit modules, and more particularly to improved connectors accommodating the high density I/O connections to the circuit module boards to facilitate interchangeability thereof.

2. Description of the Prior Art.

As the size of the circuit modules is reduced and the quantity of modules employed is increased, the density of the I/O connections per unit length of edge of the module board becomes extremely critical. The problem of size reduction is recognized in many fields. For example, in the computer field the circuit components are made as small as possible and the circuits are placed close together to reduce the electrical path lengths, to increase the speed of operation, reduce noise signals and to improve the impedance characteristics of the interconnections. The smallness of the I/O edge conductors are the close proximity thereof on the module boards place exacting requirements on the connectors which are to be acceptable for use. An example of the problem in the computer art is a presently employed rectangular module board with as many as 50 edge-contacting conductors per inch. It is apparent that the I/O connectors used for such a device will be restricted in both the conductor size and conductor spacing.

Additionally, when numerous conductors are located on a flat surface, such as a module board, it is extremely difficult, if not impossible, to have all of the conductors at a uniform height. The resulting irregularities in height further complicate the making of a positive connection to each conductive element of the circuit board with attendant irregularities in the impedance characteristics.

SUMMARY OF THE INVENTION

The electrical connector device of the present invention overcomes disadvantages of prior known constructions and includes the features and advantages of providing a good disengageable high-density electrical connector assembly enabling the connecting of I/O conductive elements of a module board with the corresponding cable connector wires of a data processing system.

Briefly, the high-density circuits connector assembly comprises a signal and ground overlay that is registered and solder-attached to the signal conductors at the edges of a module board. The signal and ground overlays are printed patterns produced by conventional photomechanical and plating techniques using laminated or etched copper material on a thin flexible polyimide substrate, such as KAPTON or the like. The overlays are adapted to be pressure connected by a force mechanism to the I/O strips on the module support frames of a data processing system. The force mechanism includes a resilient pad directly in contact with the overlays that distributes an applied load to the signal conductors and the ground conductors. The structure serves to provide good electrical connections having substantially matched impedance characteristics for the electrical connecting elements.

It is a primary object of the invention to provide an improved electrical connecting assembly for connecting the edge-connecting conductive elements of a module board with the I/O connecting strips of a data processing system.

It is a further object of the invention to provide a high-density connecting assembly with the capability of providing substantially matched impedance characteristics between the connecting elements.

The foregoing and other objects, features and advantages of the invention will be apparent from the following more particular description of a preferred embodiment of the invention, as illustrated in the accompanying drawings.

DESCRIPTION OF THE PREFERRED EMBODIMENT

Figure 1:
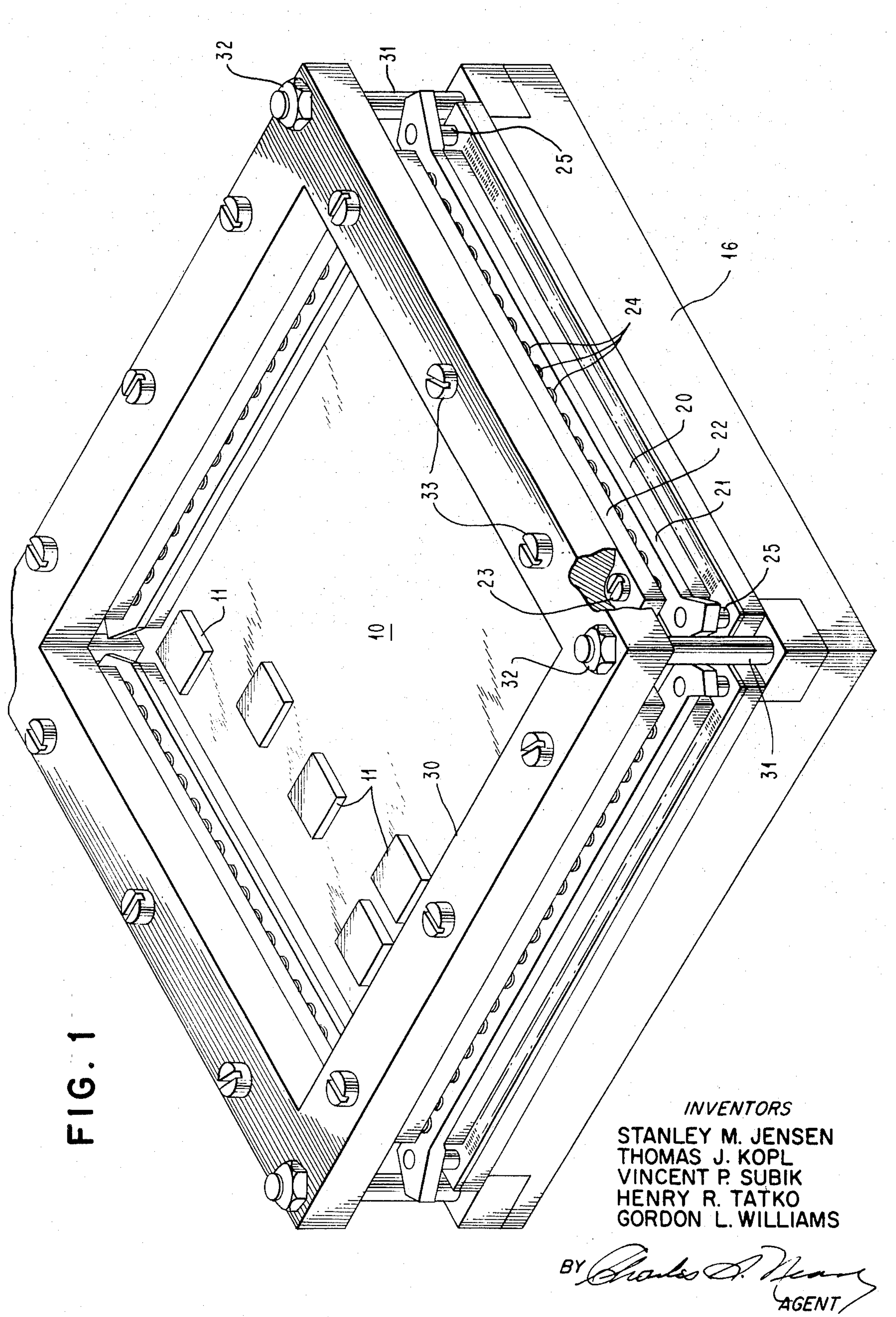
FIG. 1 is an isometric view of interconnecting pressure-applying apparatus for the edge connecting and I/O strips according to the present invention.
Figure 2:
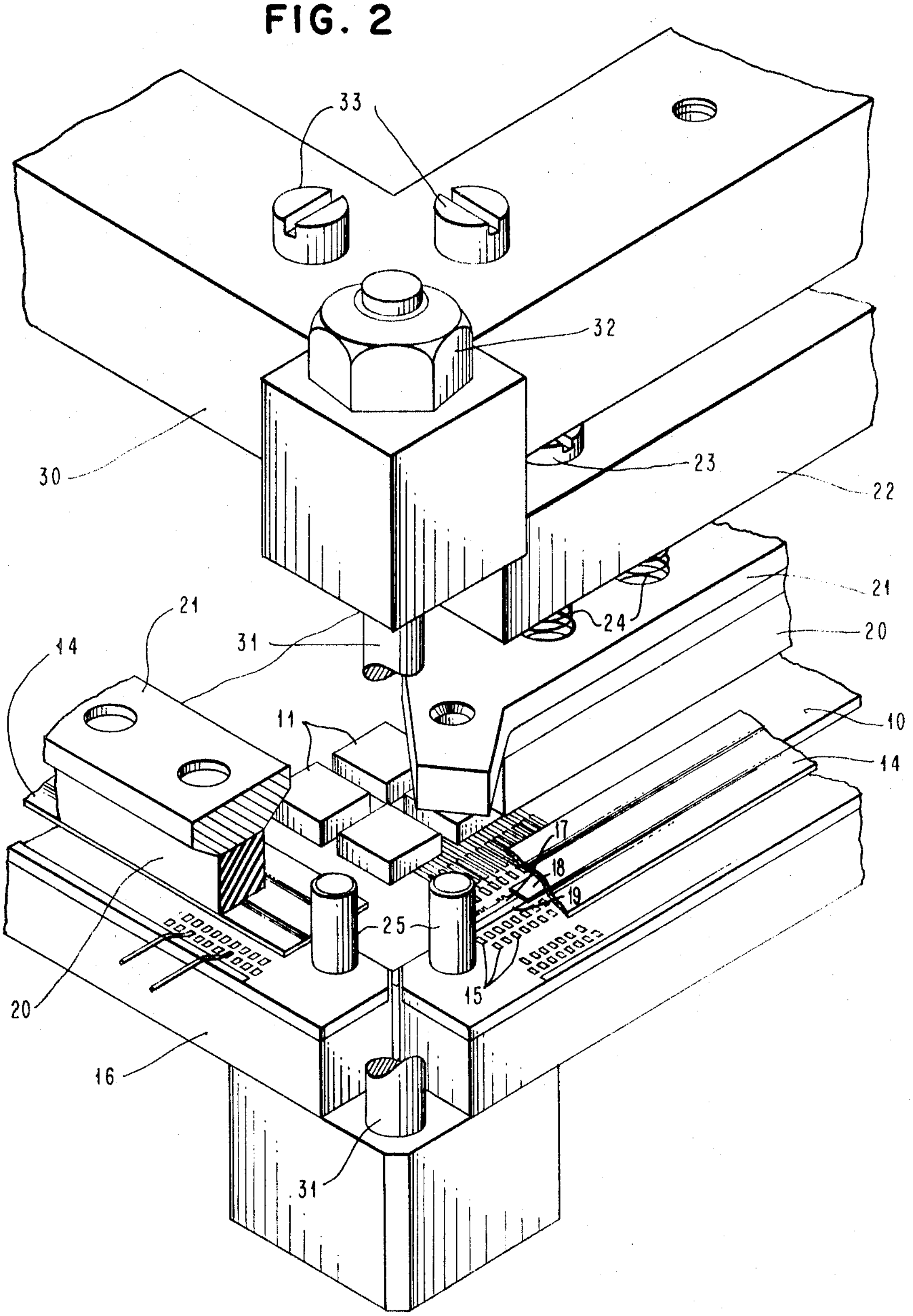
FIG. 2 is an enlarged fragmentary view showing a corner portion of the pressure-applying apparatus shown in FIG. 1.
Figure 3:
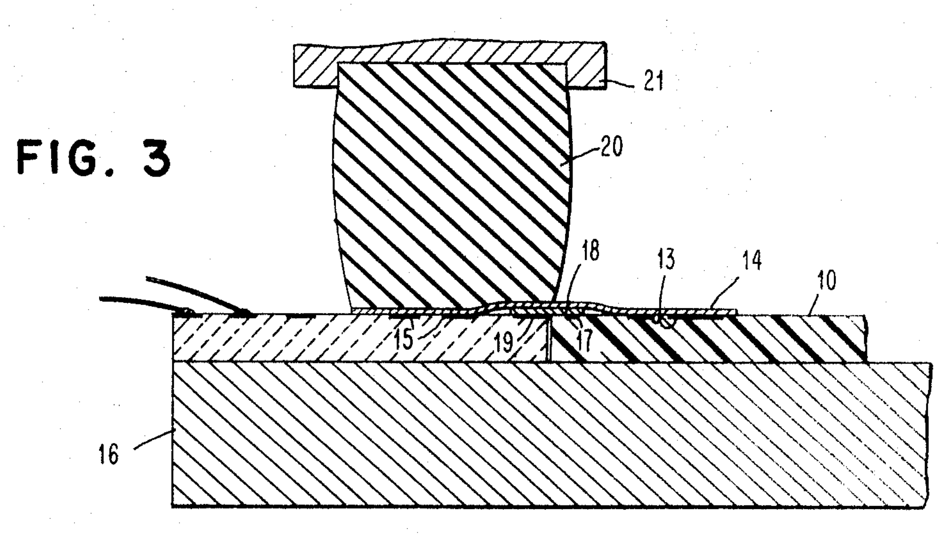
FIG. 3 is an enlarged sectional view showing the manner in which a pressure pad of the pressure-applying apparatus contacts the signal and ground overlay for exerting pressure on the flexible strip and the I/O conductive elements.
Figure 4:
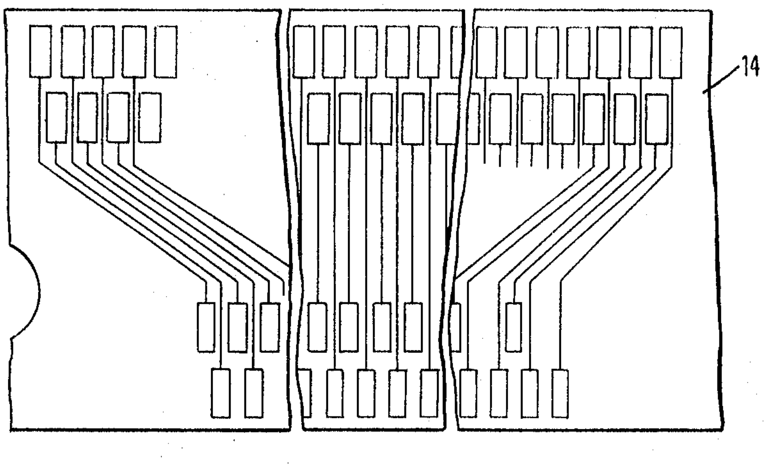
FIG. 4 is an enlarged fragmentary showing of the conductive elements affixed to the signal conductor overlay.
Figure 5:
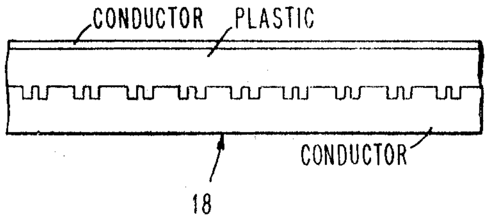
FIG. 5 is an enlarged fragmentary showing of the ground conductive strips on a ground overlay.
Figure 6:
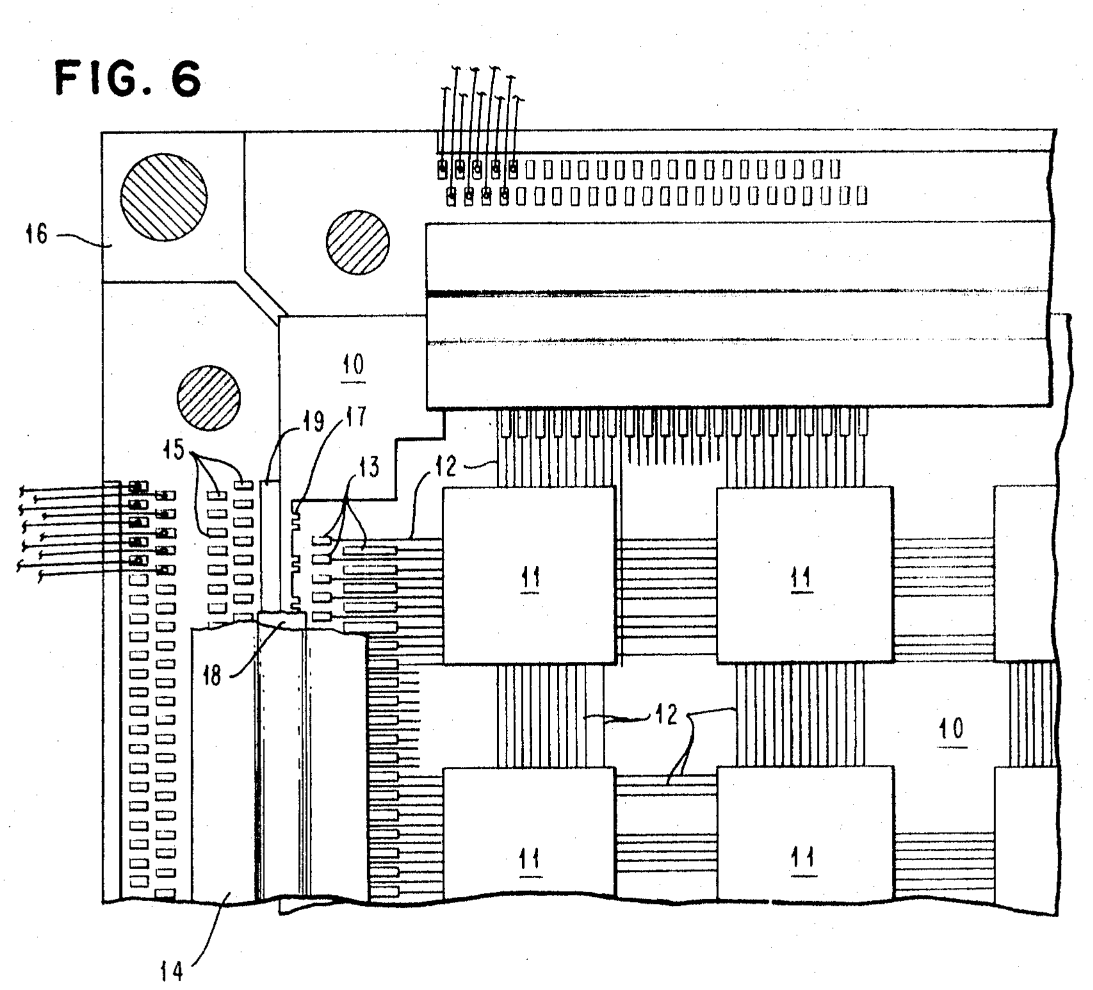
FIG. 6 is an enlarged fragmentary plan view of a corner of a module board and base frame assembly.

In FIGS. 1 and 6 there is shown a module board 10 having a plurality of integrated circuit modules 11 attached thereto. The miniaturized circuits of the modules are preferably logic circuits suitable for use in data processing systems of various types, but the type of circuits are immaterial to this invention. The board 10 has a substrate or dielectric material such as ceramic, epoxy glass or the like and includes a plurality of conductive lines 12 attached thereto which serve to interconnect the circuit modules 11 on the board and also to the highly dense arrangement of connector pads 13 occurring along each of the four edges of the board that function to accommodate the I/O signals, the electrical potential supplies and ground lines. The connector pads 13 are designed to occupy the smallest space possible. In such a design, there may be as many as 50 connector pads per inch along the board edge. As a consequence of the high density it may be necessary to stagger the connecting pads 13 of the I/O strips with a particular attention to the spacing between conductive lines so as to prevent "short circuiting".

Integral with the module board 10 and attached to the connector pads 13 by solder, infrared red or equivalent processes is an overlay circuit interconnecting element 14 comprising a thin flexible film of KAPTON or the like and having printed circuit patterns thereon created by conventional photomechanical and plating techniques. The overlay circuit interconnecting element is designed and adapted to make the electrical connections with corresponding electrical connectors 15 of the I/O strips which are affixed to the main frames 16 of the data processing system and which support the module boards 10.

Also integral with the module board 10 and attached to the ground conductor 17 by solder, red or equivalent process is a ground overlay circuit element 18 comprising a thin flexible film of KAPTON (trademark E. DuPont de Nemours) or the like and having a ground connecting circuit pattern thereon. This ground overlay circuit element 18 is designed and adapted to make the electrical connections with a corresponding ground conductor 19 attached to the main frame 16. Therefore, in accordance with the invention, the overlay connectors are employed to electrically interconnect the module boards with the I/O strips.

When numerous conductors are located on a flat surface, it is difficult to maintain uniformity of the conductor heights. These irregularities in height complicate the making of good positive connections between conductors with a resultant variation in the impedance characteristics. To overcome these problems, the above-described overlays are important elements. Further, an addition of a pressure applying apparatus, now to be described, functions to insure positive electrical interconnections.

When the module boards 10 have been introduced into the framework 16 of the data processing system, the overlay is in position to make contact with the I/O strips connector pads 15 and ground connectors 19. The pressure actuator or force-applying mechanisms are then put in place along the four edges of the module board 10 and in a position overlying the overlay elements 14 and 18. This force-applying mechanism includes a resilient pad 20 held by the supporting member 21 and a rigid or stiffener element 22. The supporting member 21 is in a spaced relationship to the stiffener element 22 by means of mounting screws 23 and by a plurality of springs 24 intermediate of the mounting screws 23 for yieldably applying pressure to the support member 21. There are four of these assemblies, one for each side of the module board. Each of these pressure-applying assemblies is positioned on a pair of guide pins 25 which function to maintain the pressure mechanism in proper alignment with the overlays and I/O strips.

A square bracket or loading frame 30 overlies the pressure-applying assemblies and particularly the stiffener elements 22. The load frame 30 is secured to the main frame 16 by studs 31 and nut arrangements 32 at each corner as shown in FIG. 1. The load frames 30 include a number of adjusting screws 33, the ends of which bear against the rigid stiffener elements 22 of the pressure-applying assemblies and function to provide a pressure-adjusting means.

In accordance with the present invention, a data processing system would include a base frame 16 or gate frame for holding a plurality of module boards 10 usually in the latticework configuration. An advantage of this design would permit interchangeability of the module boards 10 to accommodate changes of function within the data processing system, removal of module boards 10 to enable repair work and field engineering changes.

While the invention has been particularly shown and described with reference to a preferred embodiment thereof, it will be understood by those skilled in the art that various changes in form and details may be made therein without departing from the spirit and scope of the invention.

What I claim is:

1. Modular data processing apparatus comprising, in combination:

a. a base frame structure adapted to receive and hold a modular circuit board assembly and including a plurality of conductive pads thereon connected with cabling wires of the data processing system,
b. a modular circuit board assembly including:
   1. a plurality of integral electrical circuit network modules mounted thereon,
   2. a predetermined pattern of electrical circuit lines interconnected with the integral circuit modules and terminating at the edges of the circuit board,
   3. a flexible substrate material having a plurality of circuit conductive paths thereon with one end thereof attached to the terminal ends of the surface lines at the edges of the circuit board, the other ends being arranged to overlie and make electrical contact with the conductive pads attached to the base frame structure, and,
c. a pressure-applying means adapted to apply forces to the flexible substrate material for interconnecting cooperative conductive elements.

2. Modular data processing apparatus according to claim 1 wherein the pressure-applying mechanism includes a resilient pad positionable in an overlying manner upon the flexible substrate for more uniformly applying pressures to interconnecting conductive elements.

3. Modular data processing apparatus comprising, in combination:

a. a base frame structure adapted to receive and hold a modular circuit board assembly and including:
   1. a strip of dielectric material having a plurality of conductive pads thereon and connected with cabling wires of the data processing system,
b. a modular circuit board assembly including:
   1. a plurality of integral electrical circuit network modules mounted thereon,
   2. a predetermined pattern of electrical circuit lines including signal input, signal output lines and ground lines terminating at or near the peripheral edge of the circuit board,
   3. a thin, flexible substrate of polyimide material and having a plurality of printed circuit conductive paths thereon with one end thereof attached to the terminal ends of the circuit lines at the peripheral edge of the circuit board, the other ends being arranged to overlie and make electrical contact with the conductive pads attached to the base frame structure,
c. a pressure-applying mechanism adapted to apply forces to interconnecting conductive elements, and
d. means for securing the pressure-applying mechanism relative to the base frame structure and including means for transferring pressures to the pressure-applying mechanism.

4. Modular data processing apparatus according to claim 3 wherein the pressure-applying mechanism includes a resilient pad positionable in an overlying manner upon the flexible substrate for more uniformly applying pressures to interconnecting conductive elements.

5. Modular data processing apparatus according to claim 4 additionally including:

a. a first rigid member for holding the resilient pad,
b. a second rigid member slidably supported on mounting studs attached to the first rigid member,
c. a plurality of coil springs arranged in a line and contained between the first and second rigid members.

6. Modular data processing apparatus according to claim 5 wherein the first rigid member having an extension at each end and with a guide hole therein adapted to be slidably positioned on the guide pins attached to the base frame structure.

7. Modular data processing apparatus comprising, in combination:

a. a base frame structure adapted to receive and hold a modular circuit board assembly and including:
   1. a strip of dielectric material having a plurality of conductive pads thereon and connected with cabling wires of the data processing system,
   2. a plurality of guide pins,
b. a modular circuit board assembly including:
   1. a plurality of integral electrical circuit network modules mounted thereon,
   2. a predetermined pattern of electrical circuit lines including signal input, signal output lines and ground lines terminating at or near the peripheral edge of the circuit board,
   3. a thin, flexible substrate of polyimide material and having a plurality of printed circuit conductive paths thereon with one end thereof attached to the terminal ends of the circuit lines at the peripheral edge of the circuit board, the other ends being arranged to overlie and make electrical contact with the conductive pads attached to the base frame structure,
c. a pressure-applying mechanism including:
   1. a resilient pad,
   2. a first rigid member for holding the resilient pad,
   3. A second rigid member slidably supported on mounting studs attached to the first rigid member,
   4. a plurality of coil springs arranged in a line and contained between the first and second rigid members,
   5. the first rigid member having an extension at each end and with a guide hole therein adapted to be slidably positioned on the guide pins attached to the base frame structure, and
d. means for securing the pressure-applying mechanism relative to the base frame structure and including:
   1. adjustable means for transferring pressures to the pressure-applying mechanisms.